(12) United States Patent
Saito et al.

(10) Patent No.: US 7,579,805 B2
(45) Date of Patent: Aug. 25, 2009

(54) SEMICONDUCTOR DEVICE

(75) Inventors: Atsushi Saito, Takasaki (JP); Katsuhiro Higuchi, Hitachinaka (JP); Osamu Otsuka, Atsugi (JP); Hidekazu Nishidai, Isesaki (JP); Hiroshi Houzouji, Hitachiohta (JP); Toshiaki Morita, Hitachi (JP); Yoshimasa Takahashi, Kyoto (JP); Toshiya Sato, Hitachiohta (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/587,283

(22) PCT Filed: Jan. 26, 2004

(86) PCT No.: PCT/JP2004/000658

§ 371 (c)(1),
(2), (4) Date: May 18, 2007

(87) PCT Pub. No.: WO2005/071824

PCT Pub. Date: Aug. 4, 2005

(65) Prior Publication Data
US 2007/0215316 A1 Sep. 20, 2007

(51) Int. Cl.
H02P 27/04 (2006.01)

(52) U.S. Cl. .............. 318/800; 318/767; 318/798; 318/799; 62/259.2

(58) Field of Classification Search ............. 318/800, 318/799, 798, 767; 165/104.33, 80.3, 80.4; 180/65.4; 62/259.2
See application file for complete search history.

(56) References Cited

U.S. PATENT DOCUMENTS 4,989,011 A 1/1991 Rosen et al.

(Continued)

FOREIGN PATENT DOCUMENTS

DE 197 21 526 A1 5/1997

(Continued)

OTHER PUBLICATIONS

Forms PCT/IB/338 and PCT/IPEA/409 w/ English translation (Eleven (11) pages).

(Continued)

Primary Examiner—Bentsu Ro
Assistant Examiner—David S Luo
(74) Attorney, Agent, or Firm—Crowell & Moring LLP

(57) ABSTRACT

A semiconductor device in which the lifetime of mounted components can be prolonged. A cooling system for controlling the temperature of a refrigerant through a heating section and a radiator is provided. The semiconductor device is connected to the cooling system and is cooled. A variation width ($\Delta T1$) of temperature controlled by the cooling system through the heating section and the radiator is smaller than a temperature variation ($\Delta T2$) of the refrigerant caused by variations in operating conditions of the semiconductor device ($\Delta T1 \leq \Delta T2$).

10 Claims, 14 Drawing Sheets

U.S. PATENT DOCUMENTS

| | | | | |
|---|---|---|---|---|
| 6,237,351 | B1 * | 5/2001 | Itoh et al. | 62/196.3 |
| 6,340,006 | B1 * | 1/2002 | Malatto et al. | 123/41.29 |
| 6,343,572 | B1 * | 2/2002 | Pfaff et al. | 123/41.01 |
| 6,357,541 | B1 * | 3/2002 | Matsuda et al. | 180/68.2 |
| 6,374,780 | B1 * | 4/2002 | Rutyna et al. | 123/41.12 |
| 6,450,275 | B1 * | 9/2002 | Gabriel et al. | 180/65.4 |
| 6,584,796 | B2 * | 7/2003 | Itoh et al. | 62/324.1 |
| 6,664,751 | B1 * | 12/2003 | Gabriel et al. | 318/599 |
| 6,834,511 | B2 * | 12/2004 | Hatakeyama | 62/173 |
| 6,889,516 | B2 * | 5/2005 | Sasaki et al. | 62/259.2 |

FOREIGN PATENT DOCUMENTS

| | | |
|---|---|---|
| JP | 57 17198 | 1/1982 |
| JP | 10 75583 | 3/1989 |
| JP | 7-322640 A | 12/1995 |
| JP | 10-075583 A | 3/1998 |
| JP | 11-046405 A | 2/1999 |
| JP | 1146405 | 2/1999 |
| JP | 11-122870 A | 4/1999 |
| JP | 2001-8468 A | 1/2001 |
| JP | 2002-78356 A | 3/2002 |
| JP | 2002-164491 | 6/2002 |

OTHER PUBLICATIONS

Chinese office action dated May 30, 2008 in English.
Japanese Office Action dated Feb. 17, 2009.

* cited by examiner

SEMICONDUCTOR DEVICE

TECHNICAL FIELD

The present invention relates to a semiconductor device, and more particularly to a semiconductor device for power control, such as an inverter, which is used, for example, in driving a motor.

BACKGROUND ART

Generally, a semiconductor device including a power device, such as an inverter for use in power conversion, etc., is cooled by air, water or the like so that the device temperature is held to be not higher than the operating temperature of the power device during the operation. In one known cooling structure, upper and lower surfaces of the inverter are cooled by a cooler as disclosed in, e.g., JP-A-10-75583.

DISCLOSURE OF THE INVENTION

However, the cooling structure disclosed in JP-A-10-75583 has disadvantages as follows. When the inverter is operated, the power device for controlling voltage, current, etc. in the inverter is operated to generate heat that is transmitted to cooling water for cooling the inverter, thus resulting in a variation in the temperature of the cooling water. Also, the temperature inside the inverter is changed depending on not only the operation of a microcomputer for controlling the operation of the power device which constitutes the inverter, but also the operation of a power supply, a capacitor, etc. which are used to operate the microcomputer. Thus, electronic components constituting the semiconductor device and their connected portions are subjected to a temperature variation cycle due to the temperature variation of the cooling water caused by the operation of the semiconductor device. Consequently, the lifetime of those mounted components is reduced.

An object of the present invention is to provide a semiconductor device in which the lifetime of mounted components can be prolonged.

(1) To achieve the above object, the present invention provides a semiconductor device including a cooling system for controlling temperature of a refrigerant through a heating section and a radiator, the semiconductor device being connected to and cooled by the cooling system, wherein a variation width ($\Delta T1$) of temperature controlled by the cooling system through the heating section and the radiator is smaller than a temperature variation ($\Delta T2$) of the refrigerant caused by variations in operating conditions of the semiconductor device ($\Delta T1 \leq \Delta T2$).

With those features, the lifetime of mounted components can be prolonged.

(2) Also, to achieve the above object, the present invention provides a semiconductor device including a cooling system for controlling temperature of a refrigerant through a heating section and a radiator, wherein the semiconductor device is connected to the cooling system and generates heat in amount smaller than the amount of heat generated by the heating section.

With those features, the lifetime of mounted components can be prolonged.

(3) Further, to achieve the above object, the present invention provides a vehicular cooling system installed in a vehicle comprising an internal combustion engine and a motor, the motor being controlled by a power conversion unit, the vehicular cooling system comprising a cooling unit for cooling a refrigerant; and a circulator for circulating the refrigerant cooled by the cooling unit, the cooling system operating such that the refrigerant cooled by the cooling unit is circulated by the circulator to cool the power conversion unit by the circulated refrigerant, the internal combustion engine or both the internal combustion engine and the motor are cooled by the refrigerant which has been used to cool the power conversion unit, and the refrigerant having been used to cool the internal combustion engine or both the internal combustion engine and the motor is cooled by the cooling unit, the cooling system being constituted such that a variation width ($\Delta T1$) of refrigerant temperature controlled through the internal combustion engine and the cooling unit is smaller than a temperature variation ($\Delta T2$) of the refrigerant depending on variations in operating conditions of the power conversion unit ($\Delta T1 \leq \Delta T2$).

With those features, the lifetime of mounted components can be prolonged.

(4) Still further, to achieve the above object, the present invention provides a vehicular power conversion unit mounted in a vehicle comprising an internal combustion engine and a motor, the vehicular power conversion unit converting power supplied from a battery and controlling driving of the motor, the vehicular power conversion unit being disposed, upstream of the internal combustion engine, in and cooled by a cooling system which cools the internal combustion engine by a refrigerant cooled by a cooling unit, wherein the vehicular power conversion unit comprises a casing; a cooling channel through which the refrigerant supplied from the cooling system flows; a power conversion circuit module made up of a plurality of semiconductor chips and converting the power supplied from the battery; and a conversion circuit control board made up of a plurality of electronic components and controlling driving of the semiconductor chips, the casing containing the power conversion circuit module and the conversion circuit control board, the vehicular power conversion unit being able to suppress heat transmission from the exterior such that a temperature variation width ($\Delta T2$) of the refrigerant depending on variations in operating conditions of at least the power conversion circuit module is larger than a variation width ($\Delta T1$) of temperature of the refrigerant controlled through the internal combustion engine and the cooling unit ($\Delta T2 \geq \Delta T1$).

With those features, the lifetime of mounted components can be prolonged.

BEST MODE FOR CARRYING OUT THE INVENTION

The construction of a semiconductor device according to a first embodiment of the present invention will be described below with reference to FIGS. 1-8.

First, the construction of a cooling system for the semiconductor device according to this embodiment will be described below with reference to FIG. 1.

Figure 1:
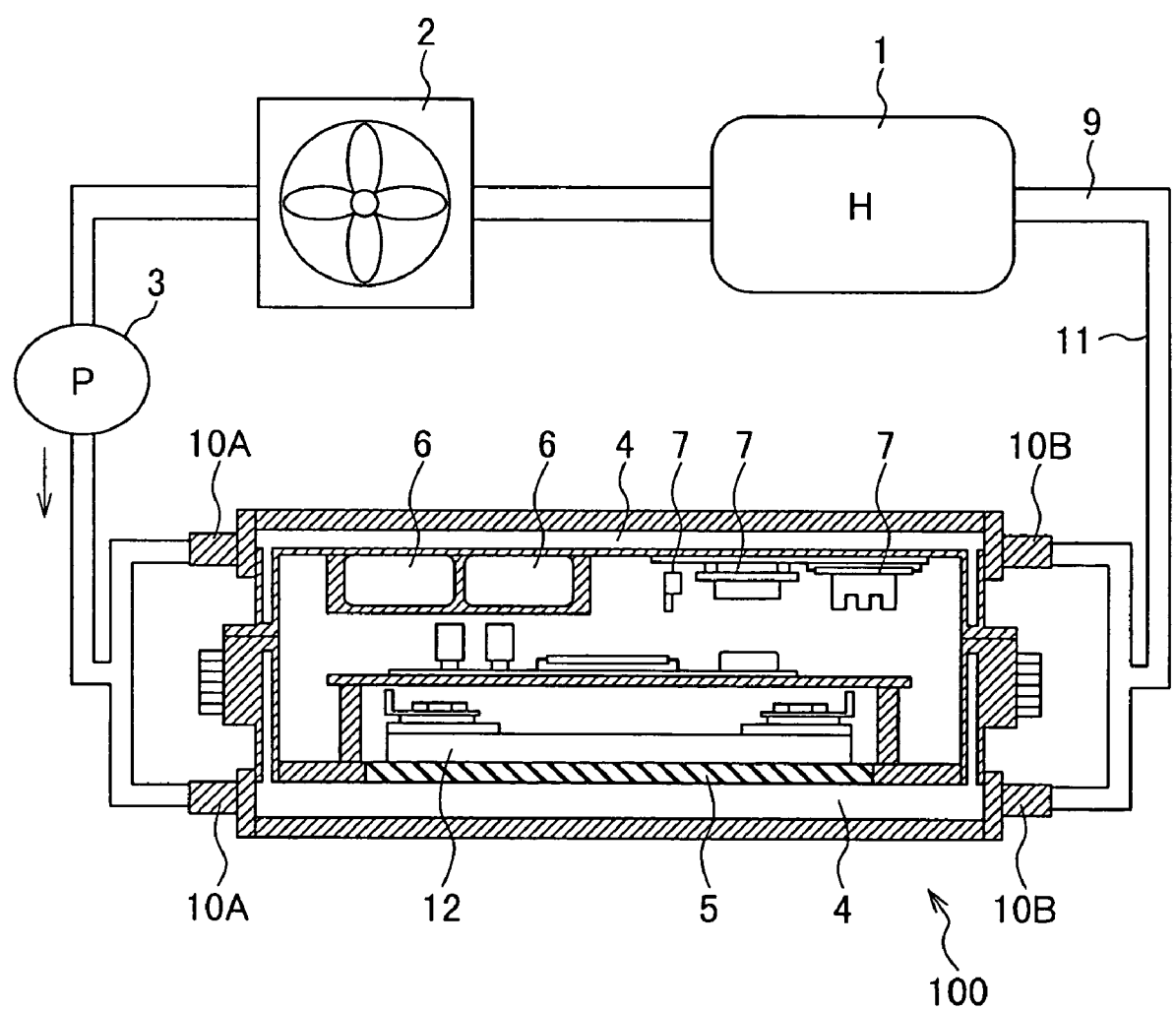
FIG. 1 is a system construction diagram of a cooling system for a semiconductor device according to a first embodiment of the present invention.

FIG. 1 is a system construction diagram of the cooling system for the semiconductor device according to the first embodiment of the present invention.

A semiconductor device 100 is connected, via pipes 11 through which a refrigerant (cooling medium) 9 flows, to a pump 3 for feeding the refrigerant, a radiator 2 for cooling the refrigerant, and to a heating section 1 other than the semiconductor device 100. The semiconductor device 100 includes therein a heating component, such as a power device, and constitutes a first heating section. In such a cooling system, the heating section 1 constitutes a second heating section which generates an amount Q1 of heat larger than an amount Q2 of heat generated by the semiconductor device 100 as the first heating section (i.e., Q1>Q2). The radiator 2 and the pump 3 are regulated so that the temperature of the heating section 1 is held within a particular range. Also, a volume through which the refrigerant 9 passes is set such that a volume V1 of the heating section 1 is sufficiently larger than a volume V2 of the semiconductor device 100 and a temperature T of the refrigerant is less apt to vary with the operation of the semiconductor device 100.

The heating section 1 is constituted, for example, by a vehicular engine. In the case of a hybrid car including an engine and a motor as driving force sources, the engine serves as the first heating section, and an inverter for controlling the motor corresponds to the semiconductor device 100 and serves as the second heating section. In the case of an electric car driven by only a motor, a large-sized motor is employed and that motor has to be cooled. Therefore, the motor serves as the first heating section, and an inverter for controlling the motor corresponds to the semiconductor device 100 and serves as the second heating section. Further, in the case of a fuel cell car, a fuel cell or a motor producing heat during power generation or both of them serve as the first heating section, and an inverter for controlling the motor, i.e., a driving force source, corresponds to the semiconductor device 100 and serves as the second heating section.

A channel 4 allowing the refrigerant to flow therethrough is formed in a housing of the semiconductor device 100. Capacitors 6, controllers 7, a power-device mounting module 12, etc. are attached to an inner wall of the housing provided with the channel 4 formed therein. The housing of the semiconductor device 100 is generally made of a die casting of aluminum, SUS or the like. A radiating section 5 of the housing on which is mounted the power-device mounting module 12 is made of, e.g., copper having a high thermal conductivity and coated with nickel plating so that heat generated with losses caused in electronic components constituting the semiconductor device is more easily transmitted to the refrigerant.

The refrigerant 9 is caused to flow through the channel 4 formed in the housing of the semiconductor device 100. More specifically, a refrigerant transport pipe is branched to form the channel 4 along each of plural surfaces of the housing for communication between a refrigerant inlet 10A and a refrigerant outlet 10B both provided in the semiconductor device. By supplying the refrigerant to the channel 4 thus formed, the refrigerant can be flown along the plural surfaces of the housing to cool the power-device mounting module 12, the capacitors 6, the controllers 7, etc. As an alternative, the channel 4 may be branched in housing walls to flow the refrigerant along the plural surfaces of the housing, thereby cooling the power-device mounting module 12, the capacitors 6, the controllers 7, etc.

The cooling system for the heating section 1, e.g., an internal combustion engine, may be constituted, instead of one system, as a plurality of cooling systems which are switched over to be able to perform temperature adjustment so that proper temperature is held in consideration of operation efficiency regardless of variations in operating conditions of the internal combustion engine. By using, as the refrigerant flown into the cooling channel 4 of the semiconductor device 100, the refrigerant which has been subjected to the temperature adjustment, the refrigerant is adjusted to a state having a temperature width optimum for the operating conditions of the internal combustion engine without causing a significant influence of the operation of the semiconductor device upon the temperature of the refrigerant. In other words, since the housing of the semiconductor device 100 includes the channel 4 through which the refrigerant controlled in temperature in the state having a small temperature variation width passes, the temperature inside the housing, which mounts therein the electronic components constituting the semiconductor device 100, is also held in the state having substantially the same temperature variation range as that of the refrigerant.

Figure 2:
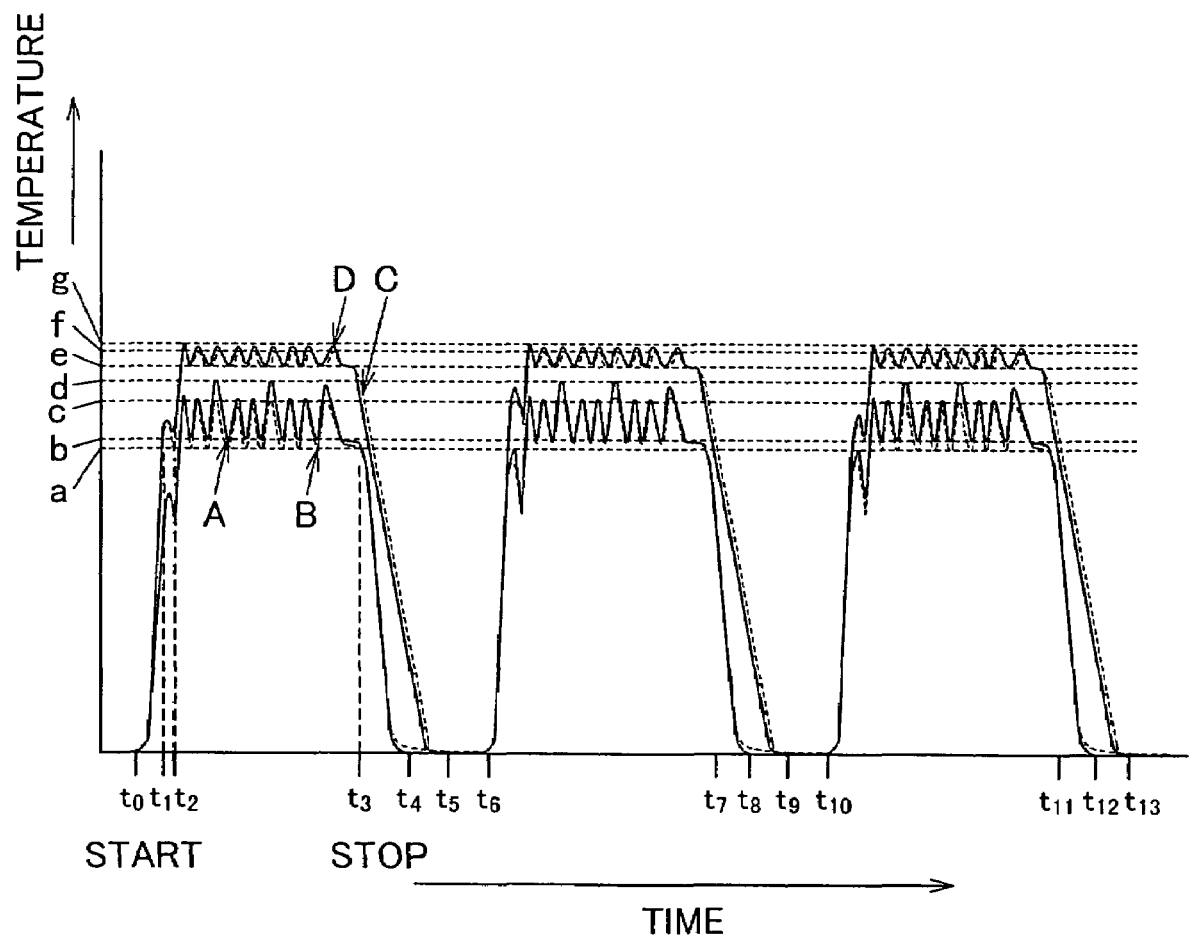
FIG. 2 is a pattern chart showing the progression of temperature variations in the cooling system for the semiconductor device according to the first embodiment of the present invention.
Figure 3:
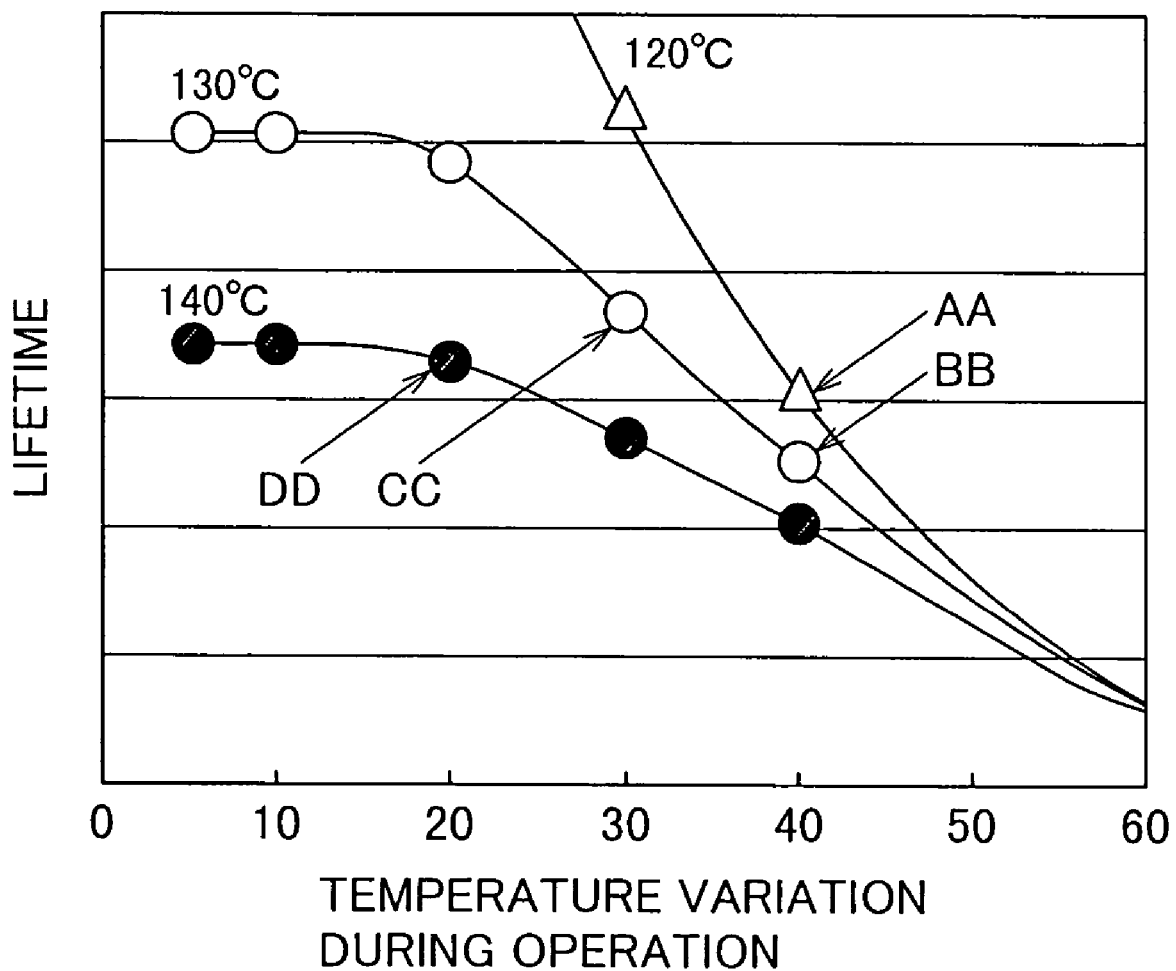
FIG. 3 is a graph for explaining the lifetime with the cooling system for the semiconductor device according to the first embodiment of the present invention.

With reference to FIGS. 2 and 3, a description is now made of the effect obtained when the refrigerant controlled in temperature in the state having a small temperature variation width is used for cooling as in the cooling system for the semiconductor device according to this embodiment.

FIG. 2 is a pattern chart showing the progression of temperature variations in the cooling system for the semiconductor device according to the first embodiment of the present invention. FIG. 3 is a graph for explaining the lifetime with the cooling system for the semiconductor device according to the first embodiment of the present invention.

In FIG. 2, a dotted line B represents the temperature of cooling water when the cooling system only for the inverter is employed as in the related art. Stated another way, the dotted line B represents the case of employing the cooling system which cools only the semiconductor device without including both the first heating section and the second heating section as in this embodiment. A solid line A represents the temperature inside the inverter when the cooling system only for the inverter is employed as in the related art. When a car is started (time t0) and the inverter starts the operation at a time t1, the temperature of the cooling water is increased with a loss caused in a power device section of the inverter. When the operation is continued and the temperature of the cooling water for the inverter exceeds a temperature a° C., the heated cooling water is cooled by a radiator fan for reducing the temperature of the cooling water, and the temperature of the cooling water is adjusted so as to fall within the range of a° C. to c° C. Thereafter, the temperature of the cooling water is heated by heat that is generated when the operating conditions of the inverter are changed depending on, for example, opening and closing of an accelerator and a loss is caused in the power module section of the inverter, while the temperature of the cooling water is reduced with the temperature adjustment by the radiator fan. Thus, the temperature of the cooling water is adjusted and varied within the range of a° C. to c° C. as represented by the dotted line B. When the operation is stopped at a time t3, a loss is no longer caused in the inverter, and the temperature of the cooling water is gradually reduced. Then, the temperature of the cooling water reaches, at a time t4, the temperature of an ambient atmosphere in which the semiconductor device is installed. Note that, for the brevity of explanation, the temperature of the ambient atmosphere when the operation is started is assumed in FIG. 2 to be equal to that when the operation is stopped.

In the related art, the temperature inside the inverter is also varied similarly to the variation in the temperature of the cooling water. When a car is started (time t0) and the inverter starts the operation, the cooling water is heated with a loss caused in the power device section of the inverter and the temperature inside the inverter is increased correspondingly. When the operation is continued and the temperature of the cooling water for the inverter exceeds the temperature a° C., the heated cooling water is cooled by the radiator fan for reducing the temperature of the cooling water, and the temperature of the cooling water is adjusted so as to fall within the range of a° C. to c° C. The interior of the inverter is further heated by heat that is generated with losses caused in a microcomputer, power capacitors, etc., which are operated to control the inverter, in addition to the operation of the inverter. Accordingly, the temperature inside the inverter during the operation is higher than the temperature of the cooling water and is repeatedly varied within the range of b° C. to d° C. When the operation is stopped at the time t3, a loss is no longer produced in the inverter, and the temperature inside the inverter is also gradually reduced along with the temperature of the cooling water. Then, the temperature inside the inverter reaches the temperature of the ambient atmosphere at the time t4. As described above, the temperature inside the inverter is varied depending on not only the variation in the temperature of the cooling water, but also the influence of heat generated with losses caused in semiconductors, etc. which constitute the inverter.

On the other hand, a dotted line C in FIG. 2 represents a variation in the temperature of cooling water for cooling, e.g., a car engine generating a large amount of heat. A solid line D represents a variation in the temperature inside the inverter when the engine cooling water is also employed as the cooling water for the inverter like this embodiment. The relationships of the internal combustion engine versus the volume of the cooling water, the cooling capability, etc. are adjusted so that the cooling water for the internal combustion engine is held substantially constant at a relatively high temperature in consideration of combustion efficiency of the internal combustion engine. Therefore, the temperature of the cooling water is increased after start of the operation and is adjusted so as to fall within the range of e° C. to f° C. after the lapse of a certain time (time t2).

The inverter has such a structure that components causing large losses, including not only the power device for power control, but also the microcomputer for controlling the operation of the inverter, the power capacitors, etc., are brought into contact with the cooling water via the inner wall of the inverter, etc. Therefore, heat generated by the microcomputer for controlling the operation of the inverter, the power capacitors, etc. with the operation of the inverter is transmitted to the cooling water via the inner wall of the inverter. As a result, the influence upon a temperature rise inside the inverter is kept small.

Because the internal combustion engine generates a large amount of heat with combustion, a large amount of the cooling water is used to cool the internal combustion engine corresponding to the amount of the generated heat, and the cooling water has a large heat capacity. Therefore, the influence of the inverter operation upon the temperature of the cooling water is small, and the temperature inside the inverter during the operation is slightly higher than the temperature of the cooling water, i.e., within the range of e° C. to g° C. When the operation is stopped at the time t3, the loss in the inverter and the heat from the internal combustion engine are no longer produced and the temperature inside the inverter is gradually reduced as the temperature of the cooling water lowers. At this time, the cooling water for cooling the internal combustion engine has a larger heat capacity than that of the cooling water used in the related art for cooling only the inverter and is harder to cool. Accordingly, the temperature of the cooling water reaches the environment temperature at a time t5 later than the time in the related art.

Thus, with the known structure, the car-mounted inverter is subjected to both of a temperature cycle within the range from the environment temperature to d° C. with start and stop of the operation, which is represented by the solid line A, and a temperature cycle within the range of b° C. to d° C. during the operation. In contrast, with the structure of this embodiment, the car-mounted inverter is subjected to both of a temperature cycle within the range from the environment temperature to g° C. with start and stop of the operation, which is represented by the solid line D, and a temperature cycle within the range of e° C. to g° C. during the operation. In other words, a variation width ($\Delta T1$) of temperature controlled by the cooling system through the heating section and the radiator and a temperature variation ($\Delta T2$) of the refrigerant caused by variations in operating conditions of the semiconductor device 100 satisfy the relationship of $\Delta T1 \leq \Delta T2$.

The lifetime N of a component repeatedly subjected to temperature stresses in such a way is expressed by the following formula (1);

$$N = A \times \Delta T^{-B} \quad (1)$$

where A and B are values decided depending on the test environment and material, and ΔT is a temperature width of the repeated temperature stresses.

Accordingly, the product lifetime can be expressed by the sum of the lifetime obtained from the formula (1) depending on the temperature variation caused with start and stop of the operation, and the lifetime obtained from the formula (1) depending on the temperature variation caused by the operation of the inverter during the engine operation.

FIG. 3 shows the results of calculating, based on the formula (1), the lifetime of an inverter component when the maximum temperature and the temperature variation width during the operation are changed. Note that, because the lifetime is changed depending on an operation model, the results of FIG. 3 are based on an optionally selected operation model.

In FIG. 3, a point AA represents the lifetime obtained on an assumption that the maximum temperature of the inverter component during the operation is 120° C. and the temperature variation during the operation is 40° C. A point BB represents the lifetime obtained on an assumption that the maximum temperature of the inverter component during the operation is 130° C. and the temperature variation during the operation is 40° C. When the maximum temperature of the inverter component during the operation is increased, the temperature width within which the temperature varies repeatedly with start and stop of the operation is increased, thus resulting in a reduction of the lifetime.

A point CC represents the lifetime obtained on an assumption that the maximum temperature of the inverter component during the operation is 130° C. and the temperature variation during the operation is 30° C. A point DD represents the lifetime obtained on an assumption that the maximum temperature of the inverter component during the operation is 140° C. and the temperature variation during the operation is 20° C. Comparing the points BB and CC, it is seen that even when the maximum temperature of the inverter component during the operation is the same value of 130° C., the lifetime is prolonged with a decrease of the temperature variation during the operation from 40° C. to 30° C.

Also, comparing the points AA and DD, it is seen that even when the maximum temperature of the inverter component during the operation is increased from 120° C. to 140° C., the lifetime can be prolonged with a decrease of the temperature variation during the operation from 40° C. to 20° C. Although the contribution of a decrease of the temperature variation during the operation to the component lifetime is changed depending on the operation model, a basic tendency is essentially the same.

For that reason, referring to the variation patterns of the temperature inside the inverter shown in FIG. 2, the lifetime of the inverter can be prolonged by reducing the influence of losses of the components constituting the inverter as in this embodiment, like the pattern represented by the solid line D, in comparison with that caused with the pattern represented by the solid line A in which the temperature inside the inverter is varied to a larger extent by the influence of losses of the components constituting the inverter.

Characteristics of the refrigerant used in the cooling system for the semiconductor device according to this embodiment will be described below with reference to FIG. 4.

Figure 4:
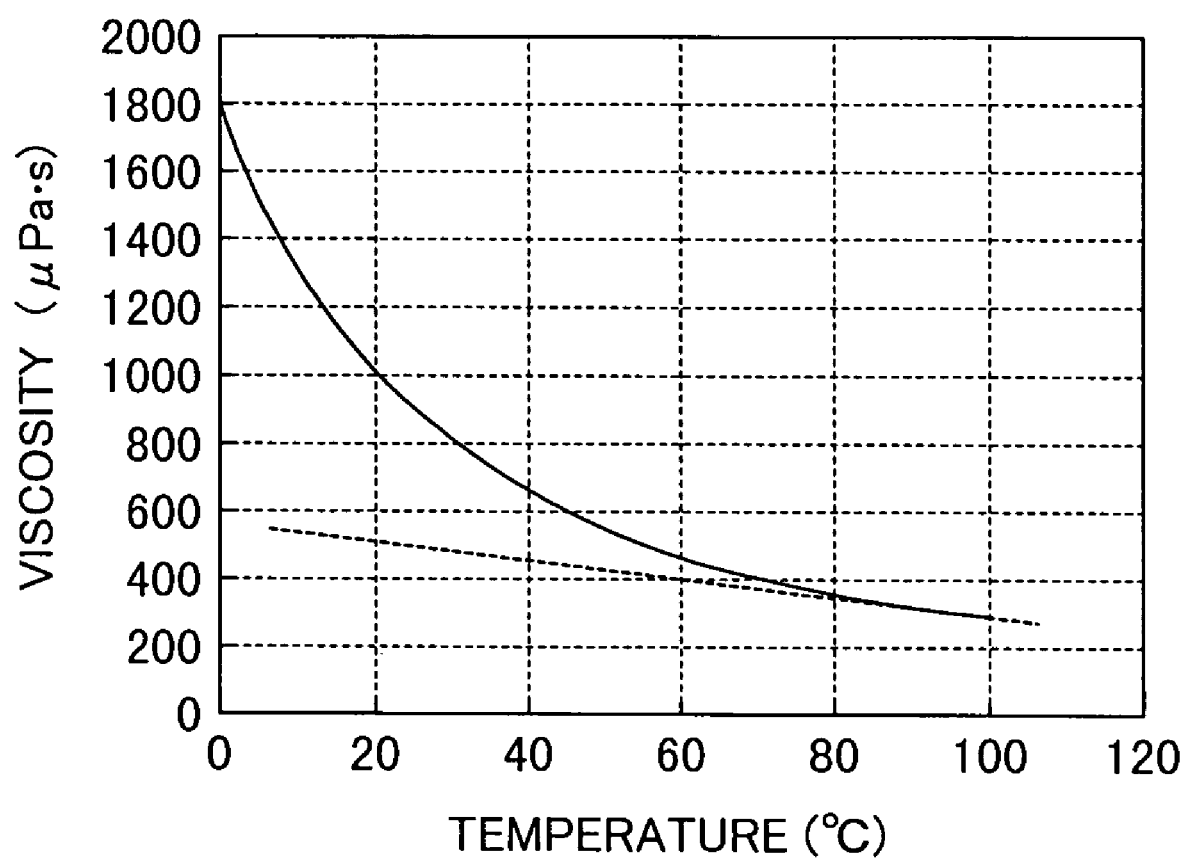
FIG. 4 is a graph for explaining the temperature dependency of a refrigerant used in the cooling system for the semiconductor device according to the first embodiment of the present invention.

FIG. 4 is a graph for explaining the temperature dependency of the refrigerant used in the cooling system for the semiconductor device according to the first embodiment of the present invention.

The refrigerant in this embodiment can be provided as water or a mixture prepared by mixing, to water, at least one of alcohols, such as ethylene glycol, propylene glycol and butylene glycol, and further adding, as required, a rust inhibitor, an antioxidant, a debubblizer or the like in proper amount, which are made of thiazole, triazole, phosphoric acid, carbonic acid, etc. The refrigerant can be used within the range of not lower than 70° C. to lower than 100° C.

FIG. 4 shows the temperature dependency of viscosity of water. Alcohols, etc. can be added in the concentration range of about 20% to 50%, taking into account the cooling capability and the environment in use. Change of viscosity depending on temperature with the addition of alcohols has substantially the same tendency as that of water. By using the temperature of the refrigerant within the range of not lower than 70° C. to lower than 100° C., therefore, the viscosity of the refrigerant can be held substantially constant, thus resulting in a smaller variation in pump feed velocity of the refrigerant and a smaller temperature variation of the refrigerant in the operation of the semiconductor device. As a result, a further improvement in reliability and lifetime of the semiconductor device can be achieved.

The cooling structure of the semiconductor device according to this embodiment will be described below with reference to FIG. 5.

Figure 5:
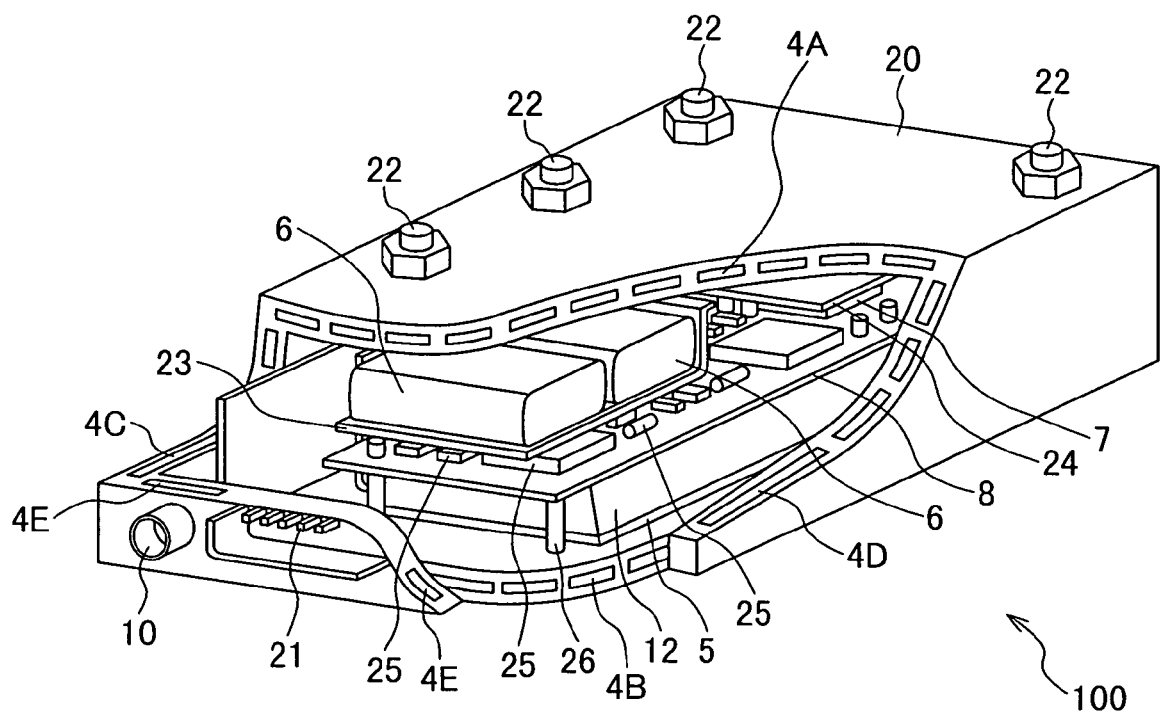
FIG. 5 is a perspective view, partially sectioned, showing the construction of the semiconductor device according to the first embodiment of the present invention.

FIG. 5 is a perspective view, partially sectioned, showing the construction of the semiconductor device according to the first embodiment of the present invention. Note that the same symbols as those in FIG. 1 denote the same components.

The semiconductor device 100 comprises various electronic components 6, 7 and 12 for performing the desired functions, and a housing 20 for containing them therein. The housing 20 includes the channel 4 through which the refrigerant flows, an inlet/outlet 10 through which the refrigerant enters and exits the housing 20, a signal input/output terminal 21 used for control of electronic equipment, and an input/output terminal 22 for, e.g., electric power controlled in accordance with signals. The signal input/output terminal 21 is coupled to the housing through a connector, and a cover or the like for coupling the connector is provided around the signal input/output terminal 21. Also, because a high level of voltage or current is used in general, the input/output terminal 22 for electric power controlled in accordance with signals is provided with a bolt and a nut for fixing the semiconductor device and a power wiring cable in use, or with a hole through which a bolt for fixing the power wiring cable is passed in use.

As described above, the smaller the temperature variation of the semiconductor device 100, the longer is the lifetime of the semiconductor device 100. To effectively develop such a property, first, the semiconductor device 100 is cooled by the refrigerant for cooling the heating section, e.g., the engine, which generates a large amount of heat. Secondly, the housing structure is formed such that the semiconductor device 100 is less affected by the variation in the external temperature. More specifically, the channel 4 for the refrigerant is formed to extend through the interiors of walls of the housing 20 along all surfaces thereof. When the housing 20 is in the form of, e.g., a rectangular parallelepiped, the channel 4 is made up of channels extending along six surfaces, i.e., a channel 4A formed along an upper surface of the housing 20, a channel 4B formed along a lower surface of the housing 20, a channel 4C formed along a left lateral surface of the housing 20, a channel 4D formed along a right lateral surface of the housing 20, a channel 4E formed along a front lateral surface of the housing 20 on the front side as viewed in the drawing, and a channel (not shown) formed along a rear lateral surface of the housing 20 on the rear side as viewed in the drawing.

The channel 4 may be formed in a finely divided manner in the interior of each wall of the housing, or in a manner spreading in the interior of each wall of the housing all over the relevant surface. Further, fin-like projections may be provided in the channel 4 so as to increase an interior surface area of the channel and to increase the cooling efficiency.

By increasing the refrigerant channel in the walls of the housing 20 as described above, it is possible to reduce the influence of the temperature variation outside the housing upon the temperature variation inside the housing. As a result, the lifetime of the semiconductor device 100 can be prolonged.

Electronic components serving as main components constituting the semiconductor device 100 and causing large losses are fixed to inner wall surfaces of the housing in which the channel 4 is formed. More specifically, the capacitors 6 are fixed by using a fixing jig 23, for example, in contact against the inner wall surface of the housing 20 with, for example, a thermally conductive paste (not shown) applied between them so that heat generated with losses caused in the capacitors 6 is transmitted to the refrigerant via the housing during the operation of the semiconductor device.

Also, among the electronic components for controlling the operation of the semiconductor device 100, the electronic component 7 causing a large loss, such as a microcomputer, is previously mounted to a substrate 24. The electronic component 7 is itself fixed to the inner wall surface of the housing 20, or a radiator (fin) portion of the electronic component is fixed to the inner wall surface of the housing 20 with, for example, a thermally conductive paste (not shown) applied between them so that heat generated with a loss caused in the electronic component is transmitted to the refrigerant via the housing.

In the module 12 on which is mounted the power device causing a large loss, a power semiconductor chip is mounted by using a solder, for example, onto an electrode pattern of a substrate made of, e.g., silicon nitride or aluminum nitride and having a high thermal conductivity. Electrodes of the semiconductor chip are connected to electrodes on the substrate by using, e.g., aluminum wires. Further, the substrate is connected by using a solder, for example, to a heat sink 5 made of, e.g., copper, molybdenum or aluminum. The heat sink is fixed to the inner wall surface of the housing 20 with, for example, a thermally conductive paste applied between them. Alternatively, the heat sink is disposed in an opening previously formed in the inner wall surface of the housing and is fixed so as to form the channel for flow of the refrigerant. In any structure, the heat generated with a loss (Joule's heat) caused in the power semiconductor chip is transmitted to the refrigerant through the housing.

Electronic components 25 causing small losses (Joule's heat) may be mounted in a structure taking no particular consideration of heat transmission to the housing. In this case, after mounting the electronic components 25 to a substrate 8, the substrate 8 is fixed to the housing 20 through spacers 26. As an alternative, like the other electronic components causing large losses, the mount substrate of the electronic components 25 may be fixed to the inner wall surface of the housing 20. The manner of fixing the electronic components and the substrate mounting thereon those electronic components is not always limited to a manner of fixing them to the upper or lower inner surface of the housing, and may be optionally modified depending on the dimensions and the loss amount of the electronic components. For example, the electronic components may be fixed in a similar manner to the lateral inner wall surface of the housing in which the cooling channel is formed.

With the construction described above, the heat generated with the losses caused during operations of the electronic components constituting the semiconductor device 100 can be transmitted from the housing to the radiator through the refrigerant, and the influence of the losses caused in the electronic components constituting the semiconductor device upon the temperature inside the housing can be reduced and a temperature rise inside the housing can be suppressed.

Accordingly, even when the ambient temperature of the semiconductor device is varied, such a temperature variation is less transmitted to the interior of the housing, and the thermal influence of the losses caused in the electronic components constituting the semiconductor device upon the temperature inside the housing can be reduced. It is hence possible to reduce the variation in the temperature inside the housing caused by the operation of the semiconductor device, and to improve the reliability and lifetime of the mounted electronic components.

Assembly steps of the semiconductor device according to this embodiment will be described below with reference to FIGS. 6-8.

FIGS. 6-8 each show successive assembly steps for the semiconductor device according to the first embodiment of the present invention. Note that the same symbols as those in FIG. 5 denote the same components.

In this embodiment, the housing 20 is divided into two parts for assembly so as to facilitate mounting of the components of the semiconductor device.

FIG. 6 shows the assembly steps for a divided lower half of the semiconductor device. As shown in FIG. 6A, the channels 4B, 4E and 4F through which the refrigerant flows are previously formed in a bottom wall (one surface) and lateral walls (four surfaces) of a lower housing 20a. The channels 4C and 4D formed in the left and right lateral walls of the housing are not shown in FIG. 5. The housing 20a is provided with ports 10A and 10B for supplying and discharging the refrigerant, and with the connector 21 for introducing control signals. The housing 20a is formed of an aluminum die casting. The radiating section 5 is formed at an inner bottom of the housing 20a. On the radiating section 5 of the housing 20a, the power device module 12 is fixed by using bolts (not shown), for example, with, e.g., thermally conductive grease (not shown) applied between them.

Figure 6A:
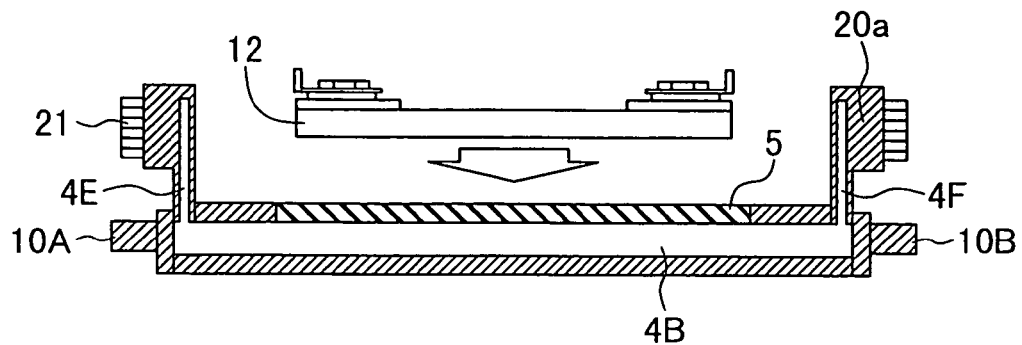
FIG. 6 shows successive assembly steps for the semiconductor device according to the first embodiment of the present invention.
Figure 6B:
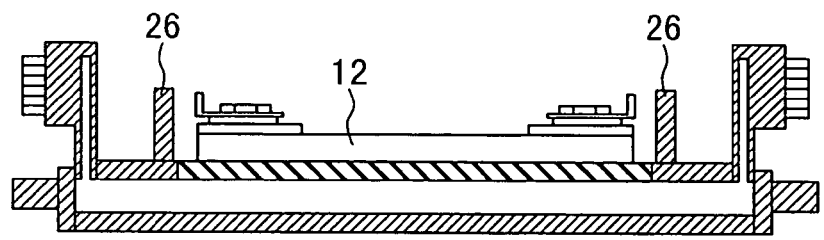

After bonding wires for the control signals to the power device module 12, as shown in FIG. 6B, the spacers 26 used for fixing the substrate on which are mounted the components causing small losses are fixed inside the housing 20a.

Figure 6C:
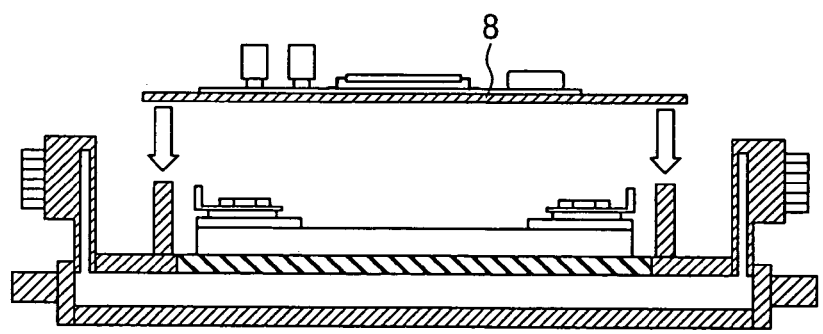
Figure 6D:
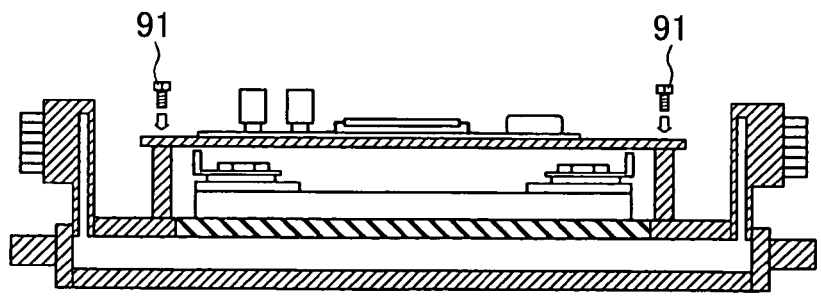

Then, as shown in FIG. 6C, the substrate 8 mounting thereon the components is attached to the spacers at a predetermined position. Further, as shown in FIG. 6D, the substrate 8 is fixed in place by using bolts 91, and wires are bonded between respective connectors of the power device module and the housing. As a result, the divided lower half of the semiconductor device is formed.

Figure 7A:
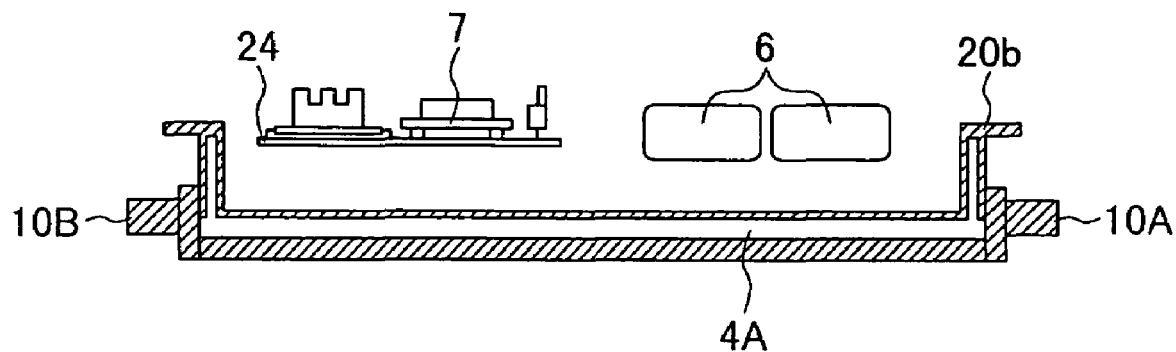
FIG. 7 shows successive assembly steps for the semiconductor device according to the first embodiment of the present invention.

FIG. 7 shows the assembly steps for a divided upper half of the semiconductor device. As shown in FIG. 7A, the upper channel 4A for the refrigerant is formed in an upper housing 20b. The housing 20b is provided with ports 10A and 10B for supplying and discharging the refrigerant. The housing 20b is formed of an aluminum die casting. Inside the upper housing 20b, the substrate 24 including the control electronic component 7, which causes a large loss and is mounted thereon in advance, and the capacitors 6 are mounted at predetermined positions with, e.g., thermally conductive grease (not shown) applied between them.

Figure 7B:
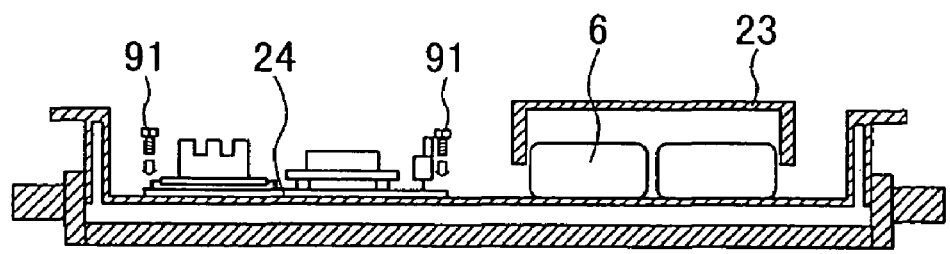

Then, as shown in FIG. 7B, the substrate 24 mounting thereon the control electronic component 7 is fixed to the inner wall surface of the housing 20b by using bolts 91. To increase the thermal conductivity to the housing 20b, the capacitors 6 are brought into close contact with the housing 20b by using the fixing jig 23, while ensuring the thermal conductivity from the surfaces of the capacitors 6 which are not in contact with the housing.

Figure 7C:
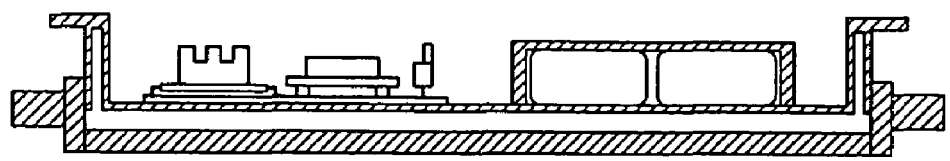

Thereafter, by connecting wires between the substrates as required, the divided upper half of the semiconductor device is formed as shown in FIG. 7C.

Figure 8A:
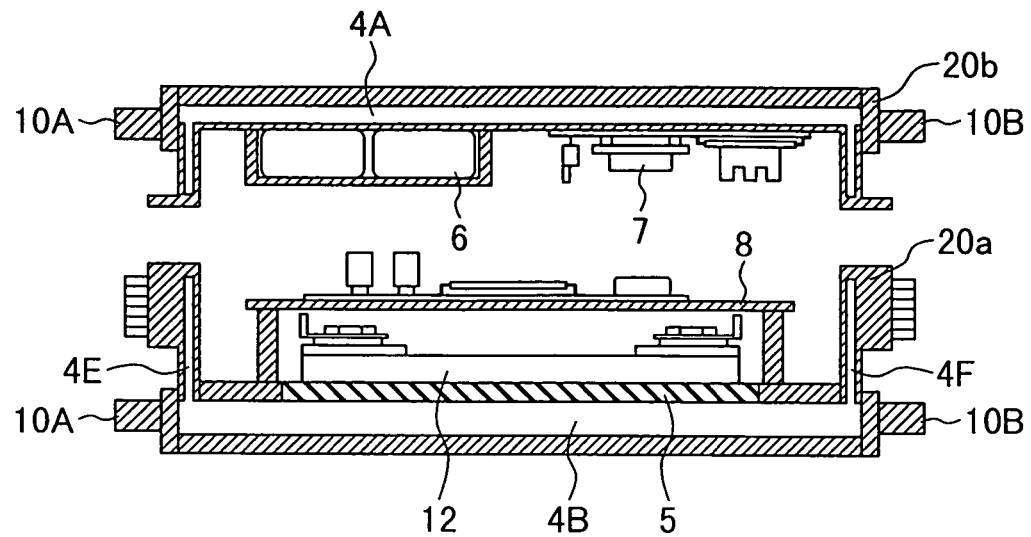
FIG. 8 shows successive assembly steps for the semiconductor device according to the first embodiment of the present invention.

FIG. 8 shows an assembly step of combining the halves of the semiconductor device, which have been manufactured through the steps shown in FIGS. 6 and 7, into the desired semiconductor device. After bonding wires for the control signals, the power, etc. between the divided semiconductor devices 20a and 20b, as shown in FIG. 8A, openings of those semiconductor devices are combined with each other.

Figure 8B:
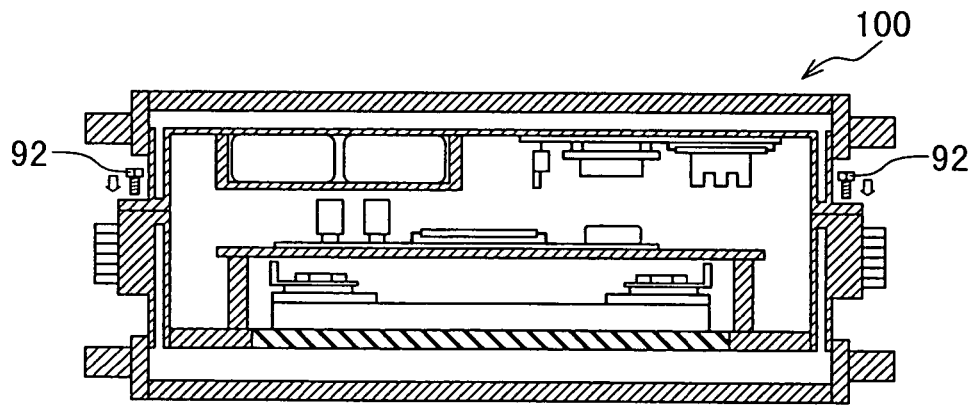

Then, as shown in FIG. 8B, the divided halves are fixed together by using bolts 92, thereby completing the semiconductor device 100 according to this embodiment.

Figure 8C:
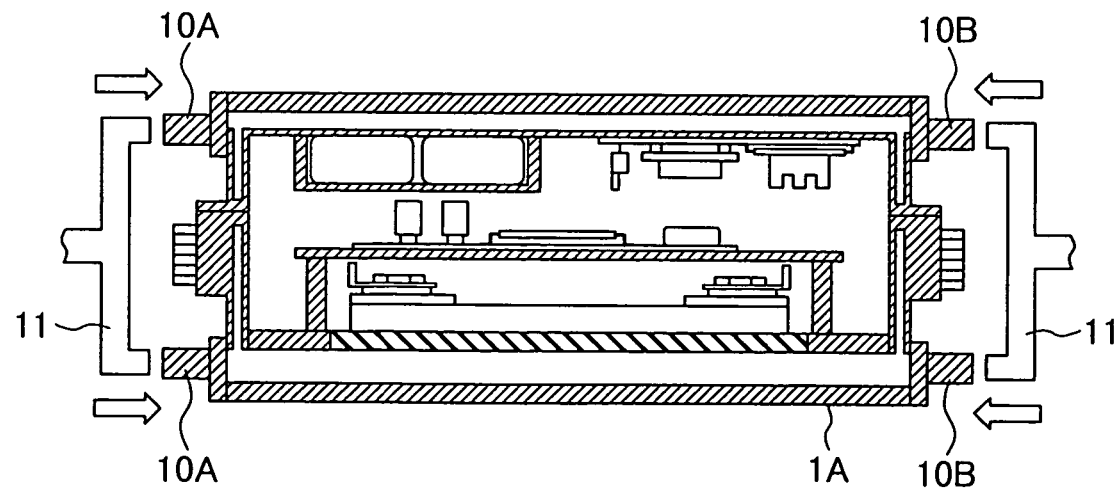

As shown in FIG. 8C, the pipes 11 for interconnecting the assembled semiconductor device 100 and the heating section, the pump, the radiator, etc. and for allowing the refrigerant having the adjusted temperature to flow therethrough are connected to the supply and discharge ports 10A and 10B of the semiconductor device, whereby the cooling system for the semiconductor device according to this embodiment is obtained.

In the assembly steps of the semiconductor device according to this embodiment, the manner and sequence of mounting the individual electronic components and the manner of dividing the semiconductor device are not necessarily limited to the above-described ones, and the semiconductor device can also be assembled by using the other suitable division method and the mounting sequence.

According to this embodiment, as described above, since the semiconductor device is also cooled by the refrigerant used for cooling the heating section having a large heat capacity, the temperature variation of the refrigerant can be kept smaller and the lifetime of the semiconductor device can be prolonged. Further, since the channel for the refrigerant is formed to extend along all the surfaces of the housing to make the semiconductor device less affected by the ambient temperature variation, it is possible to reduce the variation in the temperature inside the semiconductor device during the operation, and to improve the reliability of the semiconductor device and the connection lifetime of the mounted components.

The construction of a semiconductor device according to a second embodiment of the present invention will be described below with reference to FIGS. 9 and 10. The construction of a cooling system for the semiconductor device according to this embodiment is the same as that shown in FIG. 1.

Figure 9:
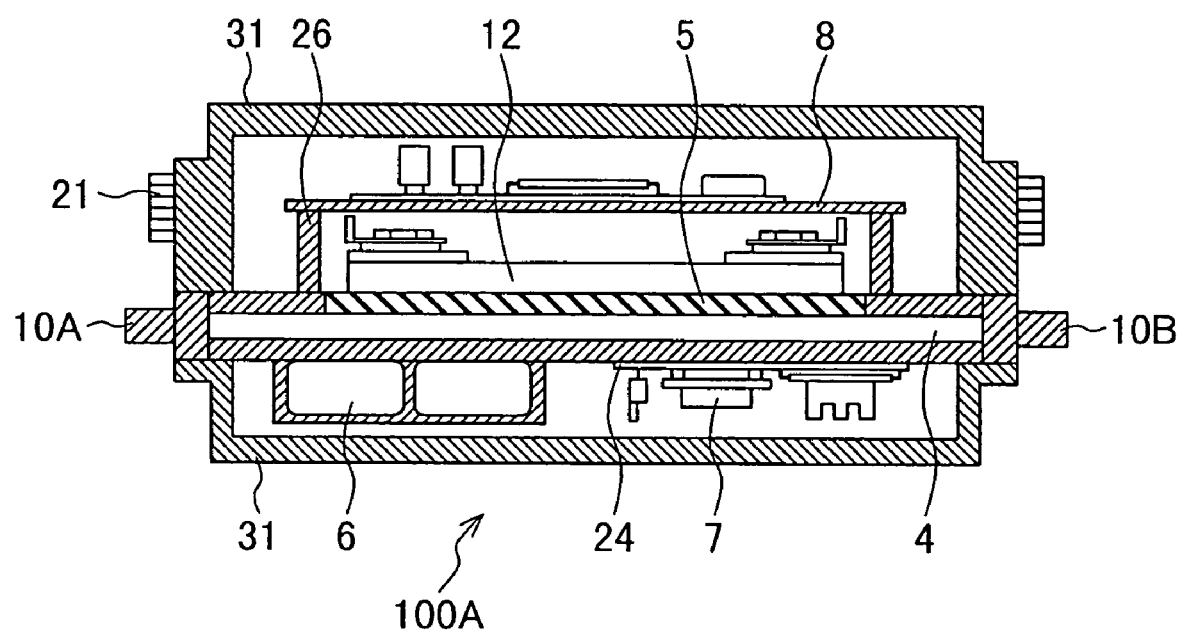
FIG. 9 is a perspective view, partially sectioned, showing the construction of a semiconductor device according to a second embodiment of the present invention.

FIG. 9 is a perspective view, partially sectioned, showing the construction of the semiconductor device according to the second embodiment of the present invention. Note that the same symbols as those in FIG. 5 denote the same components. FIG. 10 is a pattern chart showing the progression of temperature variations in the cooling system for the semiconductor device according to the second embodiment of the present invention. Note that the same symbols as those in FIG. 2 denote the same matters.

In a semiconductor device 100A of this embodiment, a cooling plate (heat sink) 5 is disposed on the upper side of a channel 4 through which the refrigerant flows, and a power semiconductor module 12, etc. are fixed to the cooling plate 5 with, e.g., a thermally conductive paste applied between them. Also, a substrate 24 mounting thereon capacitors 6 and a control component 7 is fixed to a lower surface of the channel 4 with, e.g., a thermally conductive paste applied between them. The power semiconductor module 12 and the substrate 24 mounting thereon the capacitors 6 and the control component 7 are contained in a housing 31 which is made of a material having a small thermal conductivity. The channel 4 for the refrigerant is provided with ports 10A and 10B for supplying and discharging the refrigerant. The refrigerant having temperature adjusted through the heating section 1, the radiator 2, the pump 3 and so on, shown in FIG. 1, is supplied to the supply port.

The material having a small thermal conductivity and used for the housing 31 can be prepared, for example, by covering both surfaces of a foam made of fine silica powder with aluminum or stainless plates, or by sandwiching glass wool between aluminum or stainless plates while using phenol resin or other suitable resin as a binder for the glass wool. Alternatively, those metal plates may be replaced with plates made of polyphenylene sulfide, polyetherimide, or polyether ether ketone.

With the structure described above, because the housing 31 constituting a case is made of the material having a small thermal conductivity, the temperature inside the case is less affected by the temperature variation outside the semiconductor device and is decided depending on the temperature of the refrigerant flowing in the inner side of the cooling plate 5 and the thermal influence of the losses caused in the mounted electronic components upon the interior of the housing.

Figure 10:
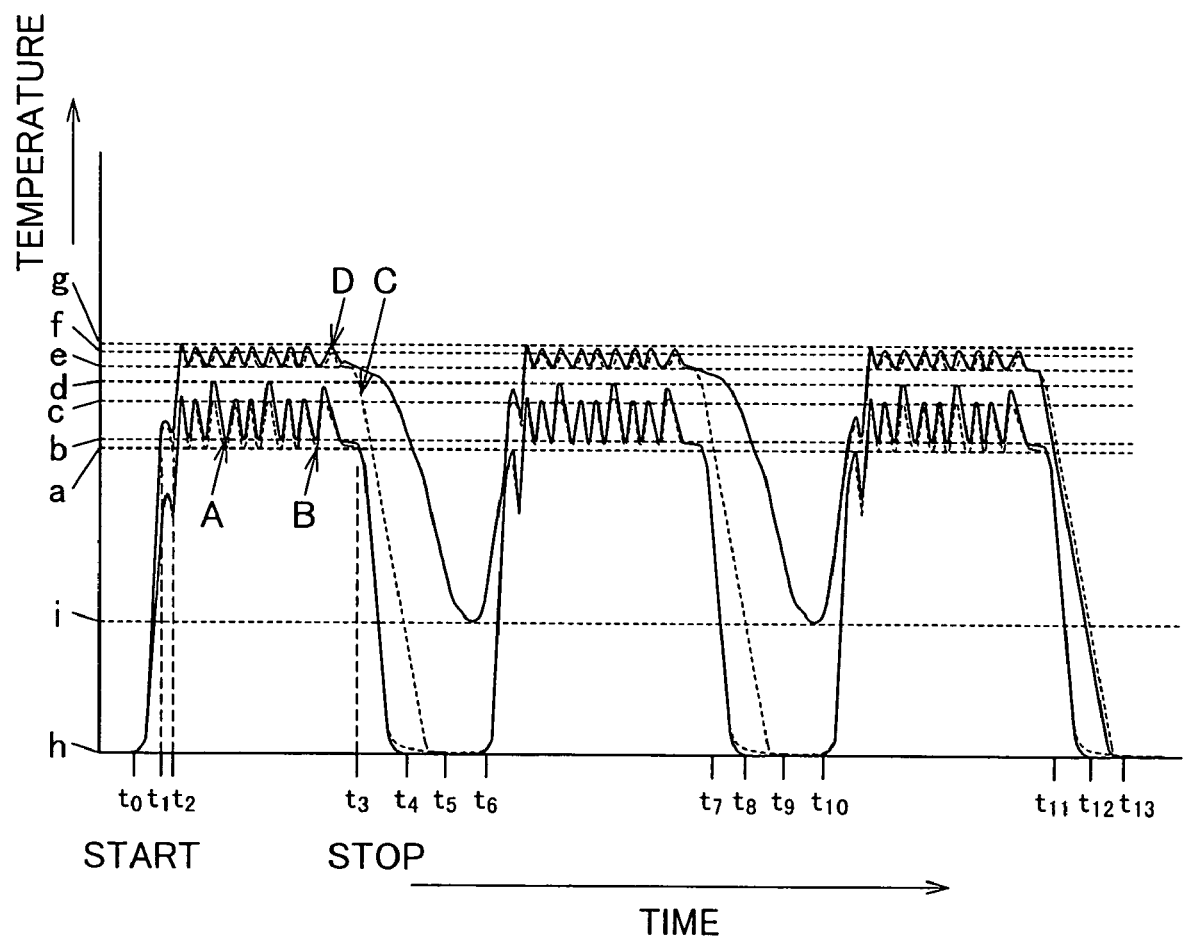
FIG. 10 is a pattern chart showing the progression of temperature variations in a cooling system for the semiconductor device according to the second embodiment of the present invention.

Thus, because of the structure that, during a period from one start-stop cycle to the next start-stop cycle, the temperature inside the inverter is hard to lower to the temperature h° C. of the ambient atmosphere in which the semiconductor device is installed, the temperature at start of the next cycle, i.e., a time t6, can be held at i° C. higher than h° C. as shown in FIG. 10, and the temperature variation width caused by the start and stop of the operation can be reduced.

The heat generated with the losses caused in the electronic components constituting the semiconductor device is transmitted to the radiator by the refrigerant flowing through the channel formed inside the cooling plate 5 on which are mounted the electronic components. It is hence possible to reduce the thermal influence of the losses caused in the electronic components constituting the semiconductor device upon the interior of the housing, to reduce the variation in the temperature inside the housing caused by the operation of the semiconductor device, and to improve the reliability and lifetime of the mounted electronic components.

According to this embodiment, as described above, since the semiconductor device is also cooled by the refrigerant used for cooling the heating section having a large heat capacity, the temperature variation of the refrigerant can be kept smaller and the lifetime of the semiconductor device can be prolonged. Further, since the housing of the semiconductor device is made of a material having a small thermal conductivity to make the semiconductor device less affected by the ambient temperature variation, it is possible to reduce the variation in the temperature inside the semiconductor device during the operation, and to improve the reliability of the semiconductor device and the connection lifetime of the mounted components.

The construction of a semiconductor device according to a third embodiment of the present invention will be described below with reference to FIG. 11. The construction of a cooling system for the semiconductor device according to this embodiment is the same as that shown in FIG. 1.

Figure 11:
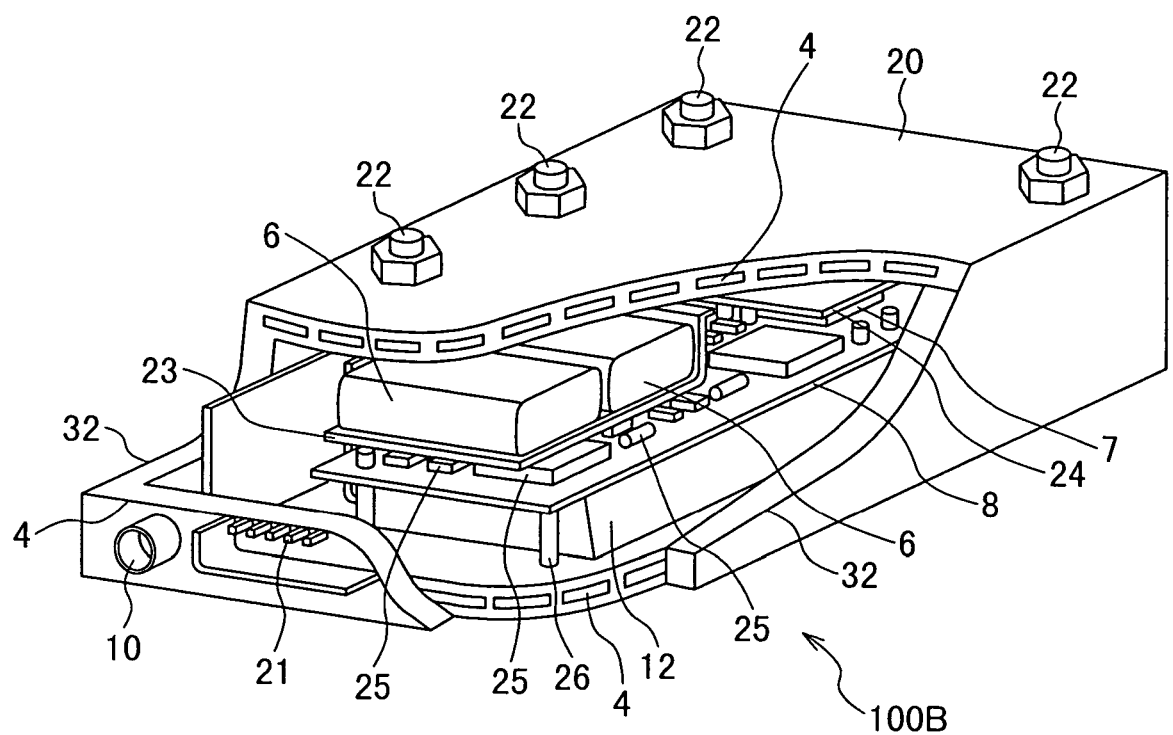
FIG. 11 is a perspective view, partially sectioned, showing the construction of a semiconductor device according to a third embodiment of the present invention.

FIG. 11 is a perspective view, partially sectioned, showing the construction of the semiconductor device according to the third embodiment of the present invention. Note that the same symbols as those in FIG. 5 denote the same components.

In this embodiment, channels allowing the refrigerant to flow therethrough are formed in upper and lower walls of a housing of a semiconductor device 100B. Further, left and right lateral walls and front and rear lateral walls of the housing 32 are each made of a material having a small thermal conductivity.

Thus, since the semiconductor device is also cooled by the refrigerant used for cooling the heating section having a large heat capacity, the temperature variation of the refrigerant can be kept smaller and the lifetime of the semiconductor device can be prolonged. Further, since the refrigerant channels are formed in the upper and lower walls of the housing of the semiconductor device and the other walls of the housing are each made of the material having a small thermal conductivity to make the semiconductor device less affected by the ambient temperature variation, it is possible to reduce the variation in the temperature inside the semiconductor device during the operation, and to improve the reliability of the semiconductor device and the connection lifetime of the mounted components.

The construction of a semiconductor device according to a fourth embodiment of the present invention will be described below with reference to FIG. 12. The construction of a cooling system for the semiconductor device according to this embodiment is the same as that shown in FIG. 1.

Figure 12:
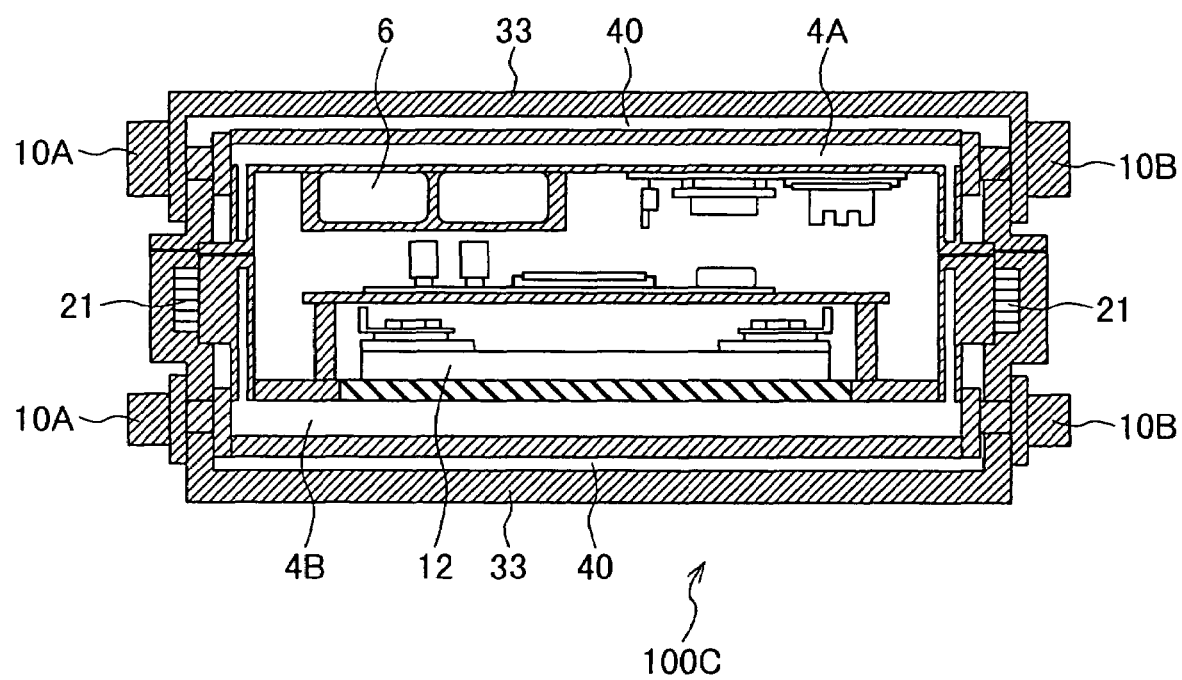
FIG. 12 is a sectional view showing the construction of a semiconductor device according to a fourth embodiment of the present invention.

FIG. 12 is a sectional view showing the construction of the semiconductor device according to the fourth embodiment of the present invention. Note that the same symbols as those in FIG. 5 denote the same components.

In a semiconductor device 100C of this embodiment, another housing 33 is disposed around the semiconductor device 100, shown in FIG. 1, with a gap left between them, and a heat insulation layer 40 is formed in the gap. The heat insulation layer 40 formed around the semiconductor device can be prepared, for example, by covering both surfaces of a foam made of fine silica powder with aluminum or stainless plates, or by sandwiching glass wool between aluminum or stainless plates while using phenol resin or other suitable resin as a binder for the glass wool. Further, by forming the outer side of the heat insulation layer using a resin material which has heat resistance and has a small thermal conductivity, such as polyphenylene sulfide, polyetherimide, or polyether ether ketone, the semiconductor device can be made less affected by the variation in the temperature of environment in which the semiconductor device is installed.

It is not always required to insert a heat insulating material to form the heat insulation layer 40. The effect equivalent to that in the case of inserting the heat insulating material can also be obtained by forming an air layer in such a manner that it is not mixed with air in the ambient atmosphere in which the semiconductor device is installed, or by forming a vacuum layer.

Thus, since the heat insulation layer 40 is formed in surrounding relation to the semiconductor device provided with the refrigerant channel, the influence of the variation in the ambient temperature upon the interior of the semiconductor device can be reduced. It is hence possible to further reduce the variation in the temperature inside the semiconductor device during the operation, and to improve the reliability, the lifetime, etc. of the semiconductor device.

The construction of a semiconductor device according to a fifth embodiment of the present invention will be described below with reference to FIG. 13. The construction of a cooling system for the semiconductor device according to this embodiment is the same as that shown in FIG. 1.

Figure 13:
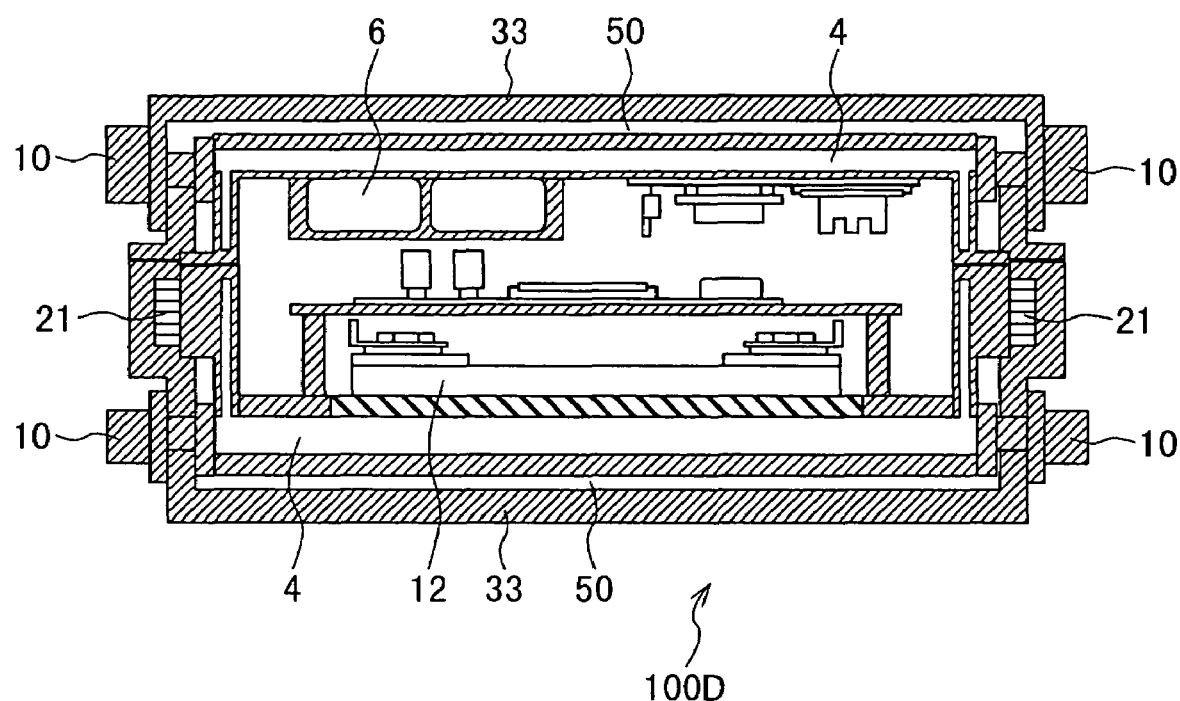
FIG. 13 is a sectional view showing the construction of a semiconductor device according to a fifth embodiment of the present invention.

FIG. 13 is a sectional view showing the construction of the semiconductor device according to the fifth embodiment of the present invention. Note that the same symbols as those in FIG. 5 denote the same components.

In a semiconductor device 100D of this embodiment, another housing 33 is disposed around the semiconductor device 100, shown in FIG. 1, with a gap left between them, and a heat storage layer 50 is formed in the gap. A heat storage material used for the heat storage layer 50 can be a latent heat storage material, such as a heat storage material made of sodium acetate hydrate or hydrated salt. Further, an outer wall of the heat storage layer may be formed by using a resin material which has heat resistance and has a small thermal conductivity, such as polyphenylene sulfide, polyetherimide, or polyether ether ketone.

By forming the heat storage layer 50 around the semiconductor device, the following advantage is obtained. During the operation of the semiconductor device, the heat storage material is melted while absorbing heat from the refrigerant. When the operation is stopped and the temperature of the refrigerant is lowered, the heat storage material is solidified while releasing latent heat during the solidification, thereby moderating a temperature fall rate of the semiconductor device. More specifically, as shown in FIG. 10, the temperature fall from the operation stop time t3 is moderated and the time until start of the next cycle is shortened. Accordingly, when the next cycle of the operation is started at the time t6 before the temperature of the semiconductor device is lowered to the environment temperature h° C., this means that the next cycle is started upon the temperature of the semiconductor device being lowered just to i° C. In this case, the range of the temperature variation with the operation of the semiconductor device from start to end is i° C. to g° C. and is narrower than the temperature variation range of h° C. to g° C. with the operation of the semiconductor device from start to end when the heat storage layer is not formed around the semiconductor device.

Thus, since the heat storage layer 50 is formed in surrounding relation to the semiconductor device provided with the refrigerant channel, the influence of the variation in the ambient temperature upon the interior of the semiconductor device can be reduced. It is hence possible to further reduce the variation in the temperature inside the semiconductor device, and to improve the reliability, the lifetime, etc. of the semiconductor device.

Figure 14:
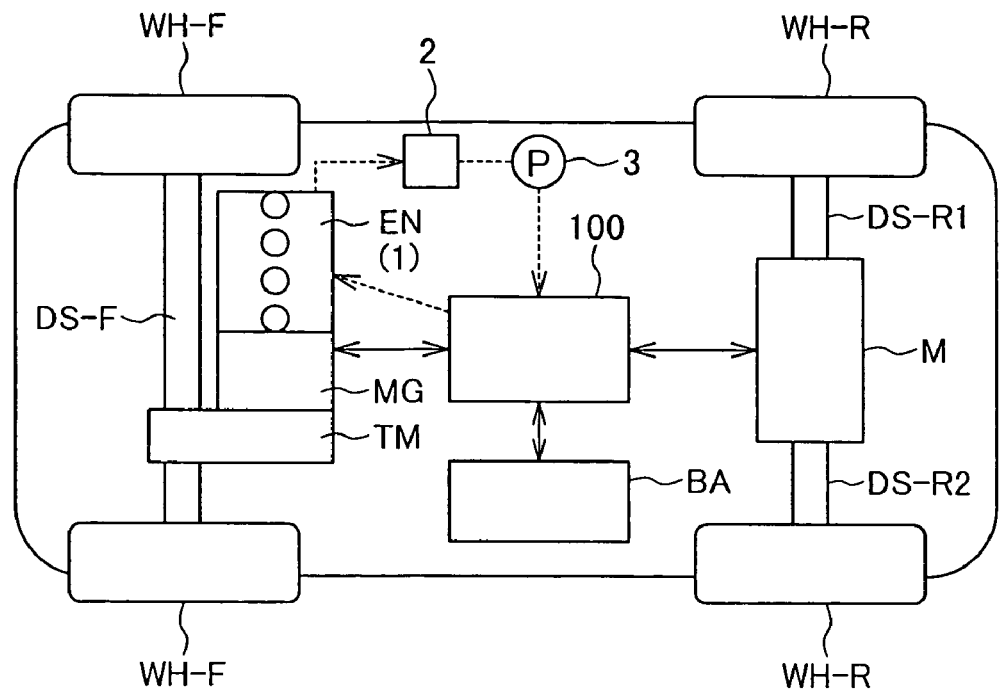
FIG. 14 is a block diagram showing a driving system of a hybrid electric car, i.e., one of electric vehicles, using a vehicular output transmission device according to any of the embodiments of the present invention.

With reference to FIG. 14, the following description is made of a driving system of a hybrid electric car, i.e., one of electric vehicles, using a vehicular output transmission device according to any of the embodiments of the present invention.

FIG. 14 is a block diagram showing the driving system of a hybrid electric car, i.e., one of electric vehicles, using the vehicular output transmission device according to any of the embodiments of the present invention.

The hybrid electric car in this embodiment is of the four-wheel-drive type that front wheels WH-F are driven by an engine (internal combustion engine) EN and a motor generator MG, and rear wheels WH-R are driven by a motor M. While this embodiment is described in connection with the case of driving the front wheels WH-F by the engine EN and the motor generator MG and the rear wheels WH-R by the motor M, the rear wheels WH-R may be driven by the engine EN and the motor generator MG, and the front wheels WH-F may be driven by the motor M.

The engine EN, the radiator 2, the pump 3, and the semiconductor device 100 are interconnected through flow passages indicated by dotted lines. The semiconductor device 100 is cooled by cooling water for the engine EN.

A transmission TM is mechanically connected to front axles DS-F of the front wheels WH-F through a differential gear (not shown). The engine EN and the motor generator MG are mechanically connected to the transmission TM through an output control mechanism (not shown). The output control mechanism (not shown) serves as a mechanism for controlling combination and distribution of rotation outputs. The AC side of the inverter constituting the above-described semiconductor device 100 (100A, 100B, 100C or 100D) is electrically connected to stator coils of the motor generator MG. The inverter is a power conversion unit for converting DC power to three-phase AC power and controls driving of the motor generator MG. A battery BA is electrically connected to the DC side of the semiconductor device 100.

The motor M is mechanically connected to rear axles DS-R1 and DS-R2 of the rear wheels WH-R. The DC side of the semiconductor device 100 is electrically connected to stator coils of the motor M. The semiconductor device 100 is shared by the motor generator MG and the motor M, and it comprises a conversion circuit section for the motor generator MG, a motor conversion circuit section for the motor M, and a drive control section for driving them.

When the hybrid electric car is started and runs at low speed (i.e., in a running region where the operation efficiency (fuel economy) of the engine EN is reduced), the front wheels WH-F are driven by the motor generator MG. While this embodiment is described in connection with the case of driving the front wheels WH-F by the motor generator MG when the hybrid electric car is started and runs at low speed, the rear wheels WH-R may be driven by the motor M in addition to the driving of the front wheels WH-F by the motor generator MG (i.e., four-wheel-drive running may be performed). DC power is supplied to the semiconductor device 100 from the battery BA. The supplied DC power is converted to three-phase AC power by the semiconductor device 100. The produced three-phase AC power is supplied to the stator coils of the motor generator MG. The motor generator MG is thereby driven to generate a rotation output. The rotation output is applied to the transmission TM through the output control mechanism (not shown). The applied rotation output is changed in speed by the transmission TM and is applied to the differential gear (not shown). The applied rotation output is distributed by the differential gear (not shown) to left and right components which are transmitted to the front axle DS-F for one front wheel WH-F and the front axle DS-F for the other front wheel WH-F, respectively. The front axles DS-F are thereby rotated. With the rotation of the front axles DS-F, the front wheels WH-F are rotated.

When the hybrid electric car runs in normal conditions (i.e., in a running region where the car runs on dry roads and the operation efficiency (fuel economy) of the engine EN is high), the front wheels WH-F are driven by the engine EN. The rotation output of the engine EN is applied to the transmission TM through the output control mechanism (not shown). The applied rotation output is changed in speed by the transmission TM. The rotation output having been changed in speed is transmitted to the front axles DS-F through the differential gear (not shown). The front wheels WH-F are thereby rotated. Also, the charge state of the battery BA is detected. When the battery BA requires to be charged, the rotation output of the engine EN is distributed to the motor generator MG through the output control mechanism (not shown), thereby rotating the motor generator MG. Thus, the motor generator MG operates as a generator. This operation of the motor generator MG generates three-phase AC power in the stator coils of the motor generator MG. The generated three-phase AC power is converted to predetermined DC power by the semiconductor device 100. The DC power produced through the conversion is supplied to the battery BA. As a result, the battery BA is charged.

When the hybrid electric car runs in the four-wheel-drive mode (i.e., in a running region where the car runs on low-$\mu$ roads, such as snow-covered roads, and the operation efficiency (fuel economy) of the engine EN is high), the rear wheels WH-R are driven by the motor M. Also, as in the above-described running state in normal conditions, the front wheels WH-F are driven by the engine EN. Further, because the amount of charges stored in the battery BA is reduced with the driving of the motor M, the motor generator MG is rotated by the rotation output of the engine EN to charge the battery BA as in the above-described running state in normal conditions. In order to drive the rear wheels WH-R by the motor M, DC power is supplied from the battery BA to the semiconductor device 100. The supplied DC power is converted to three-phase AC power by the semiconductor device 100, and the converted AC power is supplied to the stator coils of the motor M. The motor M is thereby driven to produce the rotation output. The produced rotation output is distributed to left and right components which are transmitted to the rear axle DS-R1 for one rear wheel WH-R and the rear axle DS-R2 for the other rear wheel WH-R, respectively. The rear axles DS-R1, DS-R2 are thereby rotated. With the rotation of the rear axles DS-R1 and DS-R2, the rear wheels WH-R are rotated.

When the hybrid electric car is accelerated, the front wheels WH-F are driven by the engine EN and the motor generator MG. While this embodiment is described in connection with the case of driving the front wheels WH-F by the engine EN and the motor generator MG when the hybrid electric car is accelerated, the rear wheels WH-R may be driven by the motor M in addition to the driving of the front wheels WH-F by the engine EN and the motor generator MG (i.e., four-wheel-drive running may be performed). The combined rotation output of the engine EN and the motor generator MG is applied to the transmission TM through the output control mechanism (not shown). The applied rotation output is changed in speed by the transmission TM. The rotation output having been changed in speed is transmitted to the front axles DS-F through the differential gear (not shown). The front wheels WH-F are thereby rotated.

When the hybrid electric car is in the regeneration state (i.e., in the deceleration state where a brake is depressed, or where depression of an accelerator is moderated, or where depression of the accelerator is stopped), rotation outputs of the front wheels WH-F are transmitted to the motor generator MG through the front axles DS-F, the differential gear (not shown), the transmission TM, and the output control mechanism (not shown), thereby rotating the motor generator MG. Thus, the motor generator MG operates as a generator. This operation of the motor generator MG generates three-phase AC power in the stator coils of the motor generator MG. The generated three-phase AC power is converted to predetermined DC power by the semiconductor device 100. The DC power produced through the conversion is supplied to the battery BA. As a result, the battery BA is charged. On the other hand, rotation outputs of the rear wheels WH-R are transmitted to the motor M through the rear axles DS-R1 and DS-R2, thereby rotating the motor M. Thus, the motor M operates as a generator. This operation of the motor M generates three-phase AC power in the stator coils of the motor M. The generated three-phase AC power is converted to predetermined DC power by the semiconductor device 100. The DC power produced through the conversion is supplied to the battery BA. As a result, the battery BA is further charged.

Incidentally, the motor generator MG may also be disposed in the cooling flow passage in addition to the engine EN, the radiator 2, the pump 3, and the semiconductor device 100.

According to the electric driving system of this embodiment, the lifetime of the semiconductor device can be prolonged and the maintenance of the hybrid car can be facilitated.

Figure 15:
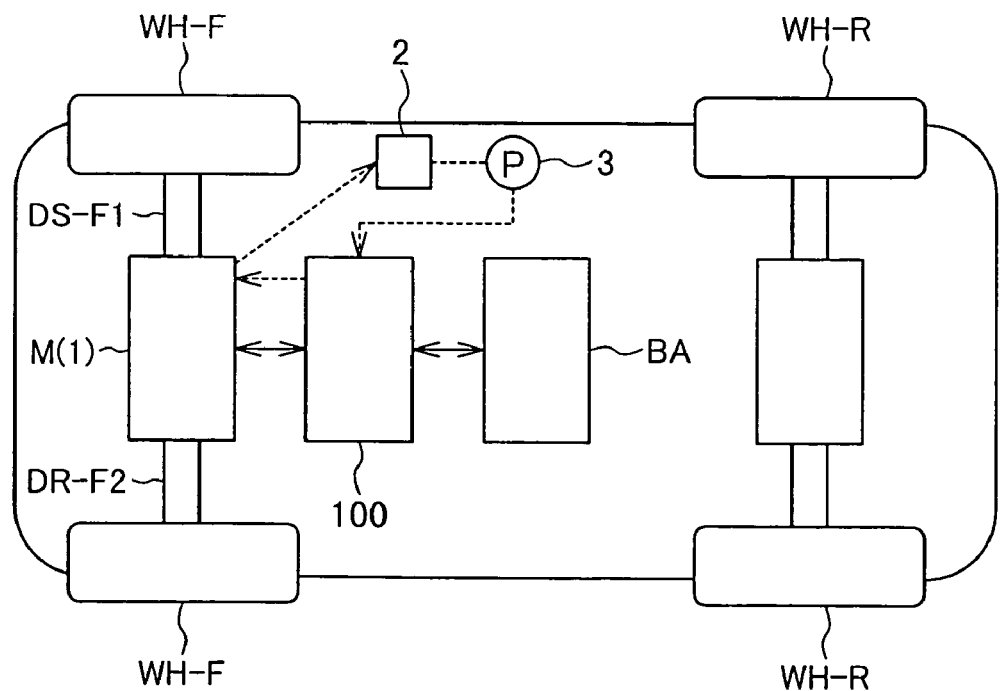
FIG. 15 is a block diagram showing a system of an electric car using the semiconductor device according to any of the embodiments of the present invention.

With reference to FIG. 15, the following description is made of the configuration of a system of an electric car, i.e., one of electric vehicles, using the semiconductor device according to any of the embodiments of the present invention.

FIG. 15 is a block diagram showing the system of the electric car using the semiconductor device according to any of the embodiments of the present invention.

Front axles DS-F1 and DS-F2 of front wheels WH-F are mechanically connected to opposite ends of an output shaft of a motor M. With that mechanical connection, an output of the motor M is transmitted to the front axles DS-F1 and DS-F2, thereby rotating the front axles DS-F1 and DS-F2. With the rotation of the front axles DS-F1 and DS-F2, the front wheels WH-F are rotated to drive the electric car constructed as shown in FIG. 15. While this embodiment is described in connection with the case of rotating the front axles DS-F1 and DS-F2 by the motor M to rotate the front wheels WH-F, rear wheels may be rotated by rotating a rear axle WH-R by the motor M.

The motor M, the radiator 2, the pump 3, and the semiconductor device 100 are interconnected through flow passages indicated by dotted lines. The semiconductor device 100 is cooled by cooling water for the motor M.

The AC side of the semiconductor device 100 is electrically connected to stator coils of the motor M. The semiconductor device 100 is a power conversion unit for converting DC power to three-phase AC power and controls driving of the motor M. A battery BA is electrically connected to the DC side of the semiconductor device 100.

When the electric car is in the powering state (i.e., when it is started, running or accelerated), the front wheels WH-F are driven by the motor M. For that purpose, DC power is supplied from the battery BA to the semiconductor device 100. The supplied DC power is converted to three-phase AC power by the semiconductor device 100. The produced three-phase AC power is supplied to the stator coils of the motor M. The motor M is thereby driven to generate a rotation output. The rotation output is distributed to left and right components which are transmitted to the front axle DS-F1 for one front wheel WH-F and the front axle DS-F2 for the other front wheel WH-F, respectively. The front axles DS-F1 and DS-F2 are thereby rotated. With the rotation of the front axles DS-F1 and DS-F2, the front wheels WH-F are rotated.

When the electric car is in the regeneration state (i.e., in the deceleration state where a brake is depressed, or where depression of an accelerator is moderated, or where depression of the accelerator is stopped), rotation outputs of the front wheels WH-F are transmitted to the motor M through the front axles DS-F1 and DS-F2, thereby rotating the motor M. Thus, the motor M operates as a generator. This operation of the motor M generates three-phase AC power in the stator coils of the motor M. The generated three-phase AC power is converted to predetermined DC power by the semiconductor device 100. The DC power produced through the conversion is supplied to the battery BA. As a result, the battery BA is charged.

According to the electric driving system of this embodiment, the lifetime of the semiconductor device can be prolonged and the maintenance of the electric car can be facilitated.

INDUSTRIAL APPLICABILITY

According to the present invention, the lifetime of the mounted components of the semiconductor device can be prolonged.

The invention claimed is:

1. A semiconductor device including a cooling system for controlling temperature of a refrigerant through a heating section and a radiator, said semiconductor device being connected to and cooled by said cooling system, wherein a variation width ($\Delta T1$) of temperature controlled by said cooling system through said heating section and said radiator is smaller than a temperature variation ($\Delta T2$) of the refrigerant caused by variations in operating conditions of said semiconductor device ($\Delta T1 < \Delta T2$); and further comprising suppression means provided to cover an outer periphery of said semiconductor device and suppressing transmission of heat from an ambient atmosphere to said semiconductor device.

2. The semiconductor device according to claim 1, wherein said suppression means is a channel formed along all surfaces of a housing covering the outer periphery of said semiconductor device and circulating the refrigerant therethrough.

3. The semiconductor device according to claim 1, wherein said channel for cooling is provided inside said semiconductor device, and electronic components constituting said semiconductor device are mounted on both sides of said channel.

4. The semiconductor device according to claim 1, wherein said suppression means is a heat insulating portion provided to cover the outer periphery of said semiconductor device and made of a material having a small thermal conductivity.

5. The semiconductor device according to claim 1, wherein said suppression means is a heat storage portion provided to cover the outer periphery of said semiconductor device.

6. The semiconductor device according to claim 1, wherein said suppression means comprises a channel formed along at least two of outer peripheral surfaces of said semiconductor device and circulating the refrigerant therethrough; and a heat insulating portion provided to cover the other outer peripheral surfaces of said semiconductor device and made of a material having a small thermal conductivity.

7. The semiconductor device according to claim 1, wherein the refrigerant is water or a mixture prepared by mixing, to water, at least one of alcohols, including ethylene glycol, propylene glycol and butylene glycol, and is used within the range of not lower than 70° C. to lower than 100° C.

8. The semiconductor device according to claim 1, wherein the semiconductor device is connected to the cooling system so that the refrigerant flowed out of the radiator flows into the semiconductor device, and the refrigerant flowed out of the semiconductor device flows into the heating section.

9. A vehicular power conversion unit mounted in a vehicle comprising an internal combustion engine and a motor, said vehicular power conversion unit converting power supplied from a, battery and controlling driving of said motor, said vehicular vower conversion unit being disposed, upstream of the internal combustion engine, in and cooled by a cooling system which cools said internal combustion engine by a refrigerant cooled by a cooling unit, wherein said vehicular vower conversion unit comprises:

a casing:

a cooling channel through which the refrigerant supplied from said cooling system flows;

a power conversion circuit module made up of a plurality of semiconductor chips and converting the power supplied from said battery; and a conversion circuit control board made up of a plurality of electronic components and controlling driving of said semiconductor chips, said casing containing said power conversion circuit module and said conversion circuit control board, said vehicular power conversion unit being able to suppress heat transmission from the exterior such that a temperature variation width ($\Delta T2$) of the refrigerant depending on variations in operating conditions of at least said power conversion circuit module is larger than a variation width ($\Delta T1$) of temperature of the refrigerant controlled through said internal combustion engine and said cooling unit ($\Delta T2 > \Delta T1$); and wherein said cooling channel is formed in said casing, and a heat insulating layer is formed in said casing by the refrigerant flowing through said cooling channel, thereby suppressing heat transmission from the exterior.

10. The vehicular power conversion unit according to claim 9, wherein heat transmission from the exterior is suppressed by forming said casing of a material having a small thermal conductivity.

* * * * *